(12) United States Patent
Sung et al.

(10) Patent No.: US 10,014,209 B2
(45) Date of Patent: *Jul. 3, 2018

(54) METHODS, APPARATUS AND SYSTEM FOR LOCAL ISOLATION FORMATION FOR FINFET DEVICES

(71) Applicant: GLOBALFOUNDRIES INC., Grand Cayman, KY (US)

(72) Inventors: Min Gyu Sung, Latham, NY (US); Ruilong Xie, Niskayuna, NY (US); Hoon Kim, Clifton Park, NY (US); Chanro Park, Clifton Park, NY (US); Sukwon Hong, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/630,546

(22) Filed: Jun. 22, 2017

(65) Prior Publication Data

US 2017/0294338 A1  Oct. 12, 2017

Related U.S. Application Data

(63) Continuation of application No. 15/075,557, filed on Mar. 21, 2016, now Pat. No. 9,722,053.

(51) Int. Cl.
*H01L 21/762* (2006.01)
*H01L 21/02* (2006.01)
*H01L 21/311* (2006.01)
*H01L 29/06* (2006.01)
*H01L 29/78* (2006.01)

(52) U.S. Cl.
CPC .. *H01L 21/76224* (2013.01); *H01L 21/02271* (2013.01); *H01L 21/02337* (2013.01); *H01L 21/31111* (2013.01); *H01L 21/31116* (2013.01); *H01L 29/0649* (2013.01); *H01L 29/785* (2013.01)

(58) Field of Classification Search
CPC combination set(s) only.
See application file for complete search history.

(56) References Cited

U.S. PATENT DOCUMENTS

2014/0227858 A1* 8/2014 Shen ............... H01L 21/76224
438/430

* cited by examiner

*Primary Examiner* — Mamadou Diallo
(74) *Attorney, Agent, or Firm* — Williams Morgan, P.C.

(57) ABSTRACT

At least one method, apparatus and system are disclosed for forming a fin field effect transistor (finFET) while reducing oxidization and fin critical dimension loss. A plurality of fins of a transistor are formed. A hard mask layer is formed on top of the fins. A first liner layer is formed over the fins and the hard mask layer. A partial deposition process is performed for depositing a first insulation material in a first portion of a channel between the fins. A second liner layer is formed above the fins, the first insulation material, and the channel. A second insulation material is deposited above the second liner layer. A fin reveal process is performed for removing the second insulation material to a predetermined height. An etch process is performed for removing the hard mask layer and the first and second liner layers above the predetermined height.

15 Claims, 12 Drawing Sheets

METHODS, APPARATUS AND SYSTEM FOR LOCAL ISOLATION FORMATION FOR FINFET DEVICES

This application is a Continuation Application of co-pending U.S. application Ser. No. 15/075,557, filed Mar. 21, 2016.

BACKGROUND OF THE INVENTION

Field of the Invention

Generally, the present disclosure relates to the manufacture of sophisticated semiconductor devices, and, more specifically, to various methods for fabricating local isolation formations for finFET devices.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a 3-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1 illustrates a stylized cross-sectional depiction of a state-of-the-art FinFET device. A FinFET device 100 illustrated in FIG. 1 comprises a plurality of "fins" 110. The semiconductor device may be position to a vertical orientation, creating one or more fins 110. The source and drain of the FinFET are placed horizontally along the fin. A high-k metal gate 120 wraps over the fin, covering it on three sides. The gate 120 defines the length of the FinFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

There is a push to scale down integrated circuits to support ever-shrinking electronic devices. This has prompted designers to reduce the size of finFET devices. As such, the pitch of the fin in finFET devices are reduced. However, as fin pitch is reduced, it becomes more difficult to fill the spaces between fins when processing finFET devices. Further, as new channel-materials (e.g., SiGe III-V material) are used in processing of finFET devices, thicker liner materials are required in order to prevent channel FIN critical dimension (CD) loss due to oxidation. However, the need for reducing fin pitch in direct contravention to the requirement of thicker liner material. FIGS. 2 and 3 illustrate these issues.

FIG. 2 shows a stylized depiction of a typical set of fins in a finFET device, between which, a liner material is deposited. FIG. 3 illustrates a stylized depiction of a typical set of fins that has experienced fin CD loss. A set of fins 210 are formed within an insulation material 215 (e.g., flowable oxide material (F-OX)). The fins 210 are formed over a substrate 205. Prior to covering the fins with an Oxide, a liner 220 is formed around fins 210. It is desirable to deposit F-OX between the fins 210. However, due to the small pitch (e.g., 50 nm) between the fins 210, an oxide void may be formed between the fins 210. It is increasingly difficult to fill the voids that form between the fins 210.

Further, due to the problems in filling the voids using state of the art processing, higher temperatures during processing is required for densification (densification anneal process). If there is a void between the fins, the fins may not be properly protected during subsequent processing, such as annealing process. If the protection material, e.g., nitride, is not deposited deep into the void between the fins, then oxidation of the fin structure could occur. In some cases, the liner 220 may not be thick enough in the voids, therefore offering less protection during a steam anneal process for the F-OX material. As a result of the lack of protection due to the line 220 being too thin during the steam anneal process performed for the F-OX, a loss of fin critical dimension (CD) 310 caused by oxidization can occur, as exemplified in FIG. 3. This could result in process errors and device performance problems.

The void formation between the fins 210 can cause downstream process problems. These downstream process problems include issues regarding dummy poly gate formation or replacement gate formation. Metal "subways" through the voids may develop. These metal subways may cause electrical shorts in various portions of the semiconductor device being manufactured.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming a fin field effect transistor (finFET) while reducing oxidization and fin critical dimension loss. A plurality of fins of a transistor are formed. A hard mask layer is formed on top of the fins. A first liner layer is formed over the fins and the hard mask layer. A partial deposition process is performed for depositing a first insulation material in a first portion of a channel between the fins. A second liner layer is formed above the fins, the first insulation material, and the channel. A second insulation material is deposited above the second liner layer. A fin reveal process is performed for removing the second insulation material to a predetermined height. An etch process is performed for removing the hard mask layer and the first and second liner layers above the predetermined height.

BRIEF DESCRIPTION OF THE DRAWINGS

The disclosure may be understood by reference to the following description taken in conjunction with the accompanying drawings, in which like reference numerals identify like elements, and in which:

FIGS. 12-20 illustrate stylized depictions of cross-sectional views of further processing fins of a finFET device, in accordance with a second embodiment of the present disclosure.

Figure 1:
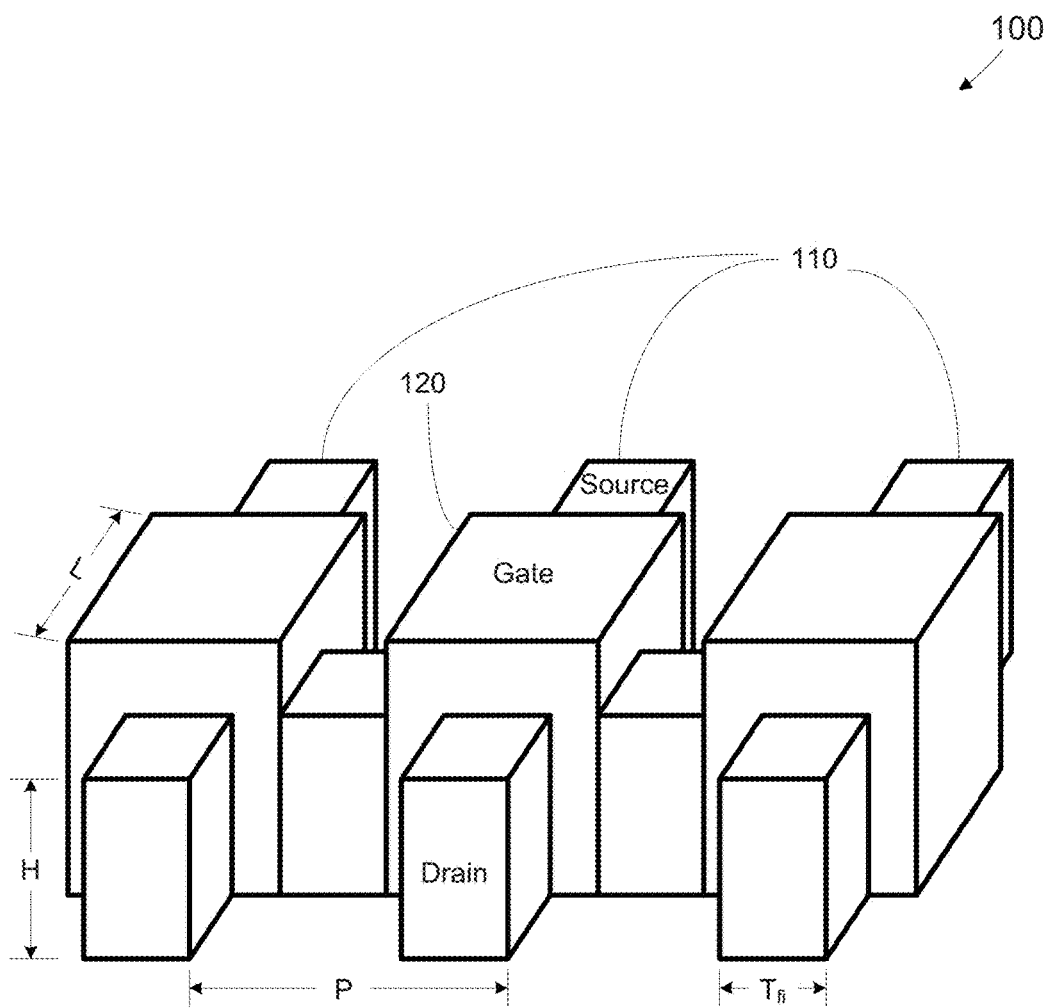
FIG. 1 illustrates a stylized cross-sectional depiction of a state-of-the-art FinFET device.
Figure 2:
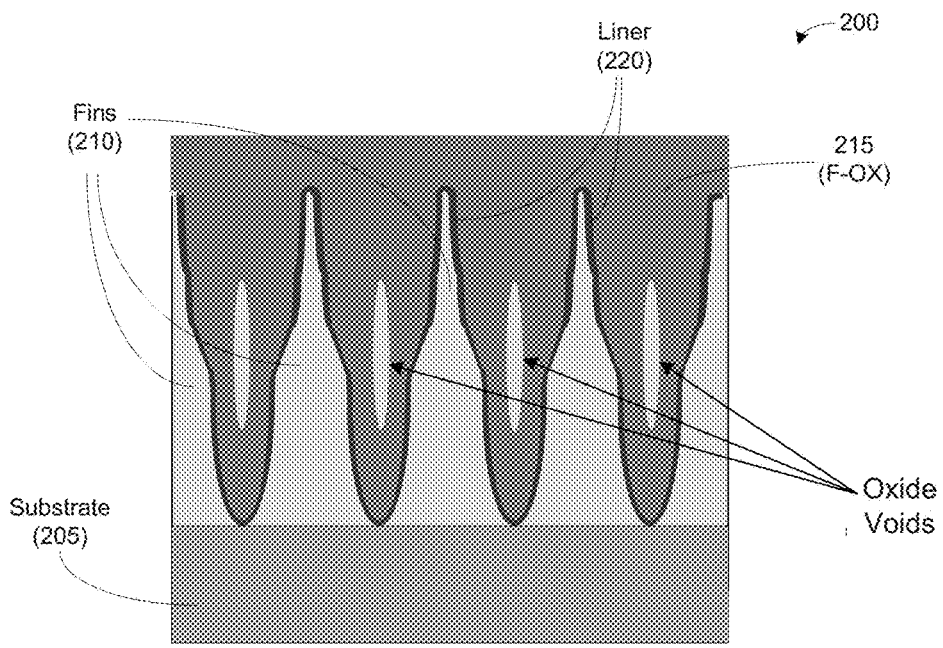
FIG. 2 illustrates a stylized depiction of a typical set of fins in a finFET devices between which a liner material is deposited.
Figure 3:
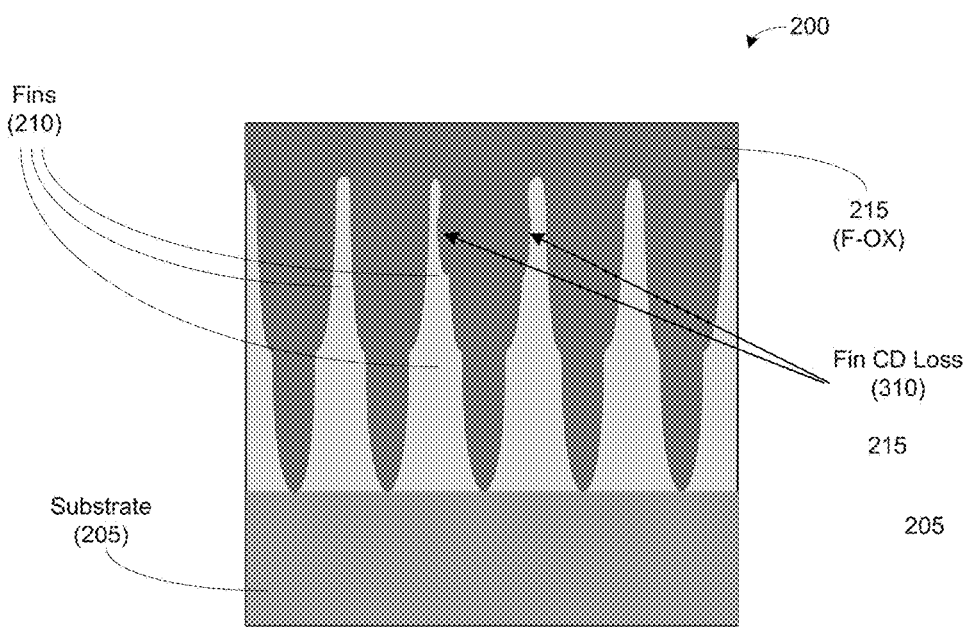
FIG. 3 illustrates a stylized depiction of a typical set of fins that has experienced fin CD loss.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide forming fins of a finFET device such that the fins are provided with isolation, and any void between the fins are substantially avoided. Embodiments herein allow for depositing flowable oxide (F-Ox) between the fins without a void between the fins. Embodiments herein also provide for filling oxide material between fins of a finFET device while reducing or substantially preventing oxidization on portions of the fins.

Figure 4:
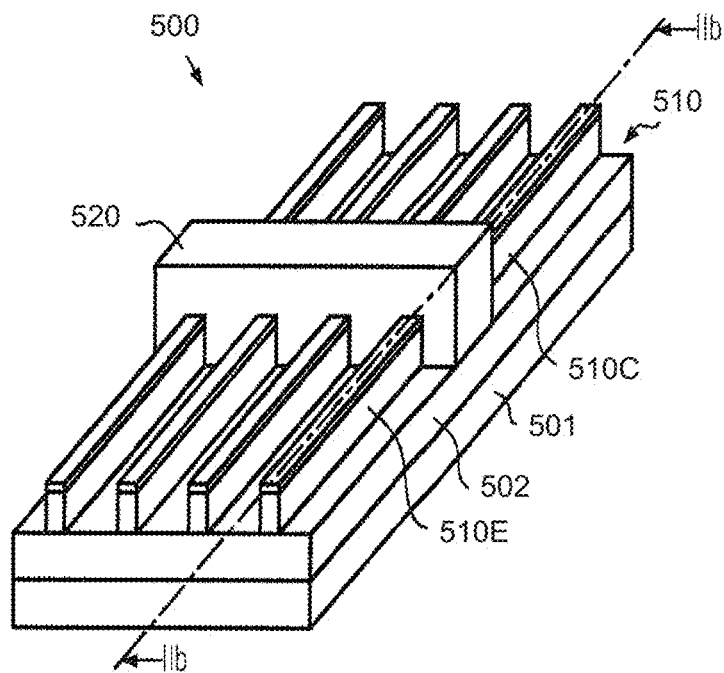
FIG. 4-6 illustrate various stylized diagrams relating to performing an initial process of forming a finFET device.
Figure 5:
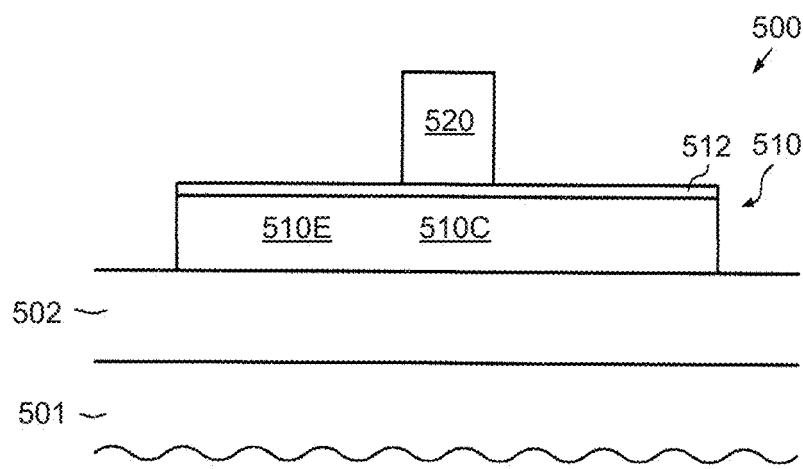
Figure 6:
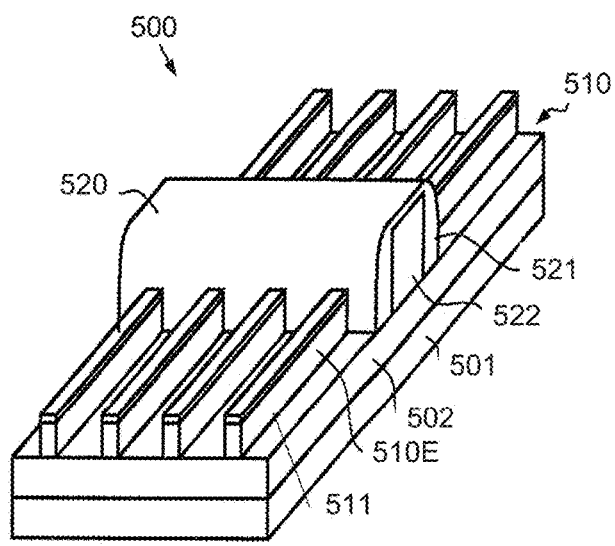
Figure 7:
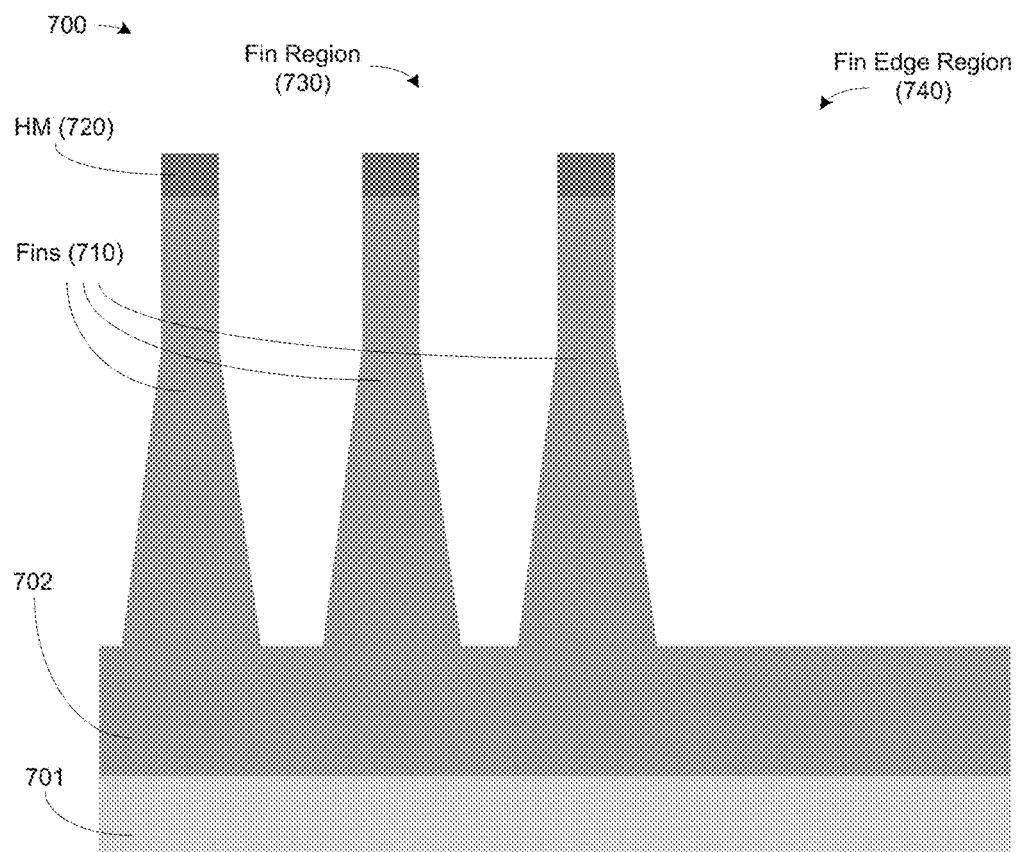
FIGS. 7-12 illustrate stylized depictions of cross-sectional views of further processing fins of a finFET device, in accordance with a first embodiment of the present disclosure.

FIGS. 4-6 illustrate various stylized diagrams relating to performing an initial process of forming a finFET device, in accordance with embodiments herein. FIG. 4 schematically illustrates a perspective view of a semiconductor device 500, which may be a finFET device comprising a plurality of fins. In the manufacturing stage shown, the device 500 may comprise a substrate 501, such as a silicon substrate or any other appropriate carrier material, on which may be formed an appropriate base layer 502, which, in some illustrative embodiments, may represent an insulating layer, such as a silicon dioxide layer, a silicon nitride layer, a silicon oxynitride layer and the like. For example, if the substrate 501 may be comprised of a substantially crystalline semiconductor material, the base layer 502, if provided in the form of an insulating material, and the substrate 501 may define a silicon on insulator (SOI) configuration.

Moreover, a plurality of fins 510 are formed on the layer 502 and comprise respective end portions 510E and a central portion 510C, which is covered by a gate electrode structure 520. Furthermore, a gate insulation material may be formed at least on sidewalls of the fins 510 (not shown in FIG. 4), while a corresponding gate insulation layer may be formed on a top surface of the fins 510 if a tri-gate transistor architecture is considered. In other cases, the fins 510 may be covered by a cap layer (not shown) which may result in an insufficient capacitive coupling to the fins 510, so that the top surface thereof may effectively not act as a channel region. With respect to any material composition of the fins 510, it is to be appreciated that any appropriate material, such as silicon, silicon/germanium, germanium or any other appropriate semiconductor compound may be used, depending on the overall device requirements. Similarly, the corresponding dimensions of the fins 510 may be selected in accordance with the design rules of the corresponding technology node under consideration.

FIG. 5 illustrates a stylized depiction of a cross-sectional view taken along the section IIb of FIG. 4. As illustrated, a cap layer 512, such as a silicon oxide layer or a high-K HFO2 layer, and/or the like, may be formed on the fins 510, and the gate electrode structure 520. The gate electrode structure 520 may be comprised of any appropriate material, such as polysilicon, a metal-containing material and the like, may be formed on the cap layer 512 and may also extend down to the layer 502 along the corresponding sidewalls of a Fin 510 (not shown in the section of FIG. 5). The semiconductor device 500 as shown in FIGS. 4 and 5 may be formed on the basis of well-established process techniques as are, for instance, also explained above with reference to the device 500.

FIG. 6 illustrates a stylized depiction of a perspective view of the transistor 500 in a further advanced manufacturing stage. As illustrated, the gate electrode structure 520 may comprise a sidewall spacer structure 521, which may be comprised of any appropriate material such as silicon nitride, silicon dioxide and the like. The spacer structure may be formed on the basis of well-established deposition and etch techniques, wherein a width of the spacer structure 520 may be selected in accordance with a desired dopant profile in each of the end portions 510E of the Fins 510. That is, moderately high dopant concentration may be established in the end portions 510E adjacent to the gate electrode structure 520, possibly by using an offset spacer element (not shown) and thereafter one or more spacer elements of the structure 521 may be provided and may be used as an implantation mask during one or more subsequent implantation steps to provide the desired high dopant concentration in the end portions 510E with a lateral distance to a gate electrode material 522 of the gate electrode structure 520. It should be appreciated that any appropriate concentration profile extending from the electrode material 522 may be established by appropriately forming a corresponding number of spacer elements in the structure 521. It should further be appreciated that any other implantation processes may be performed, for instance with respect to defining a counter doped area in the vicinity of the central portion 510C, which represents the actual channel region. Drain and source regions 511 may be formed at oppositely positioned end portions 510E having the desired dopant concentration and concentration gradient with respect to the central portion 510C.

FIGS. 7-12 illustrate stylized depictions of cross-sectional views of further processing fins of a finFET device 700, in accordance with a first embodiment of the present disclosure. In the manufacturing stage shown, the finFET device 700 may comprise a substrate 701, such as a silicon substrate or any other appropriate carrier material, on which may be formed an appropriate base layer 702, which, in some illustrative embodiments, may represent an insulating layer, such as a silicon dioxide layer, a silicon nitride layer, a silicon oxynitride layer, and/or the like. For example, if the substrate 701 may be comprised of a substantially crystalline semiconductor material, the base layer 702, if provided in the form of an insulating material, and the substrate 701 may define a silicon on insulator (SOI) configuration.

Moreover, a plurality of fins 710 are formed on the layer 702 at a fin region 730. The device 700 also comprises a fin edge region 740. The fins 710 may be formed using silicon material or silicon germanium material (e.g., SiGe III-V). In some embodiments, the fins 710 may be formed such that the spacing between the fins 710 are relatively small, e.g., 50 nm. A hard mask cap structure 720 may be formed on each of the fins 710. In one embodiment, the hard mask structure may be comprised of silicon nitride (SiN).

Figure 8:
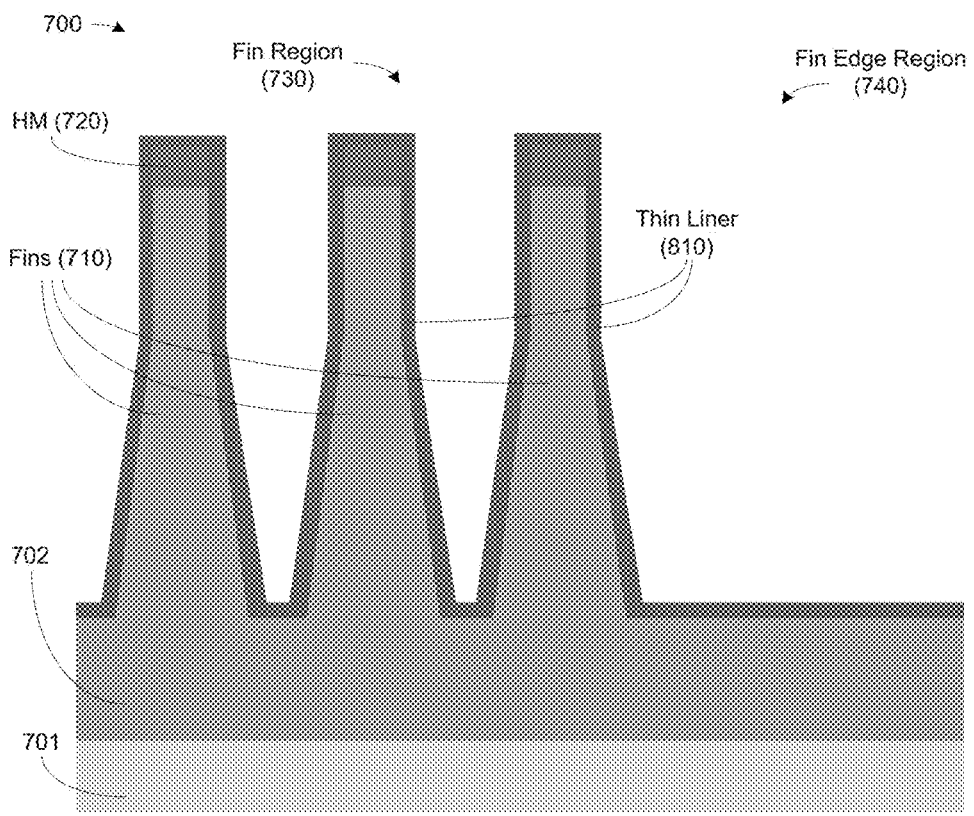

As shown in FIG. 8, a thin liner 810 is deposited on the device 700. The thin liner 810 encapsulates fins 710, the fin region 730, as well as the fin edge region 740. In one embodiment, the thin liner 810 may be comprised of silicon nitride (SiN). The thin liner 810 may be sufficiently thick to prevent or reduce fin oxidization and provide fin CD protection, yet thin enough to allow for filling of the space between the fins 710 with an insulation material, such as F-OX. In one embodiment, the thin liner 810 may be less than about 3 nm.

Figure 9:
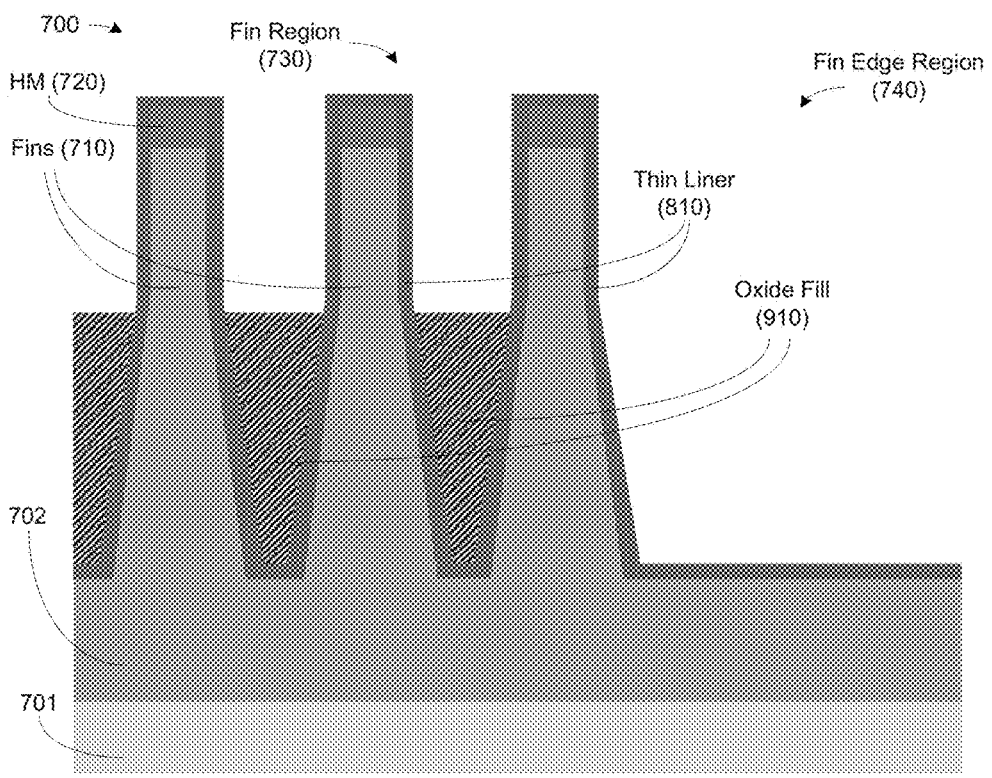

As shown in FIG. 9, a partial oxide deposition and etch back process performed in the fin region 730. Oxide material 910 (e.g., F-OX) may be deposited in the fin region 730. An etch process may then be performed to etch back the oxide material 910 down to the bottom portion of the fins 710 to a predetermined height, as depicted in FIG. 9. The oxide material 910 is deposited to a height corresponding to the narrow critical dimension (CD) of the fins 710. The oxide material is not deposited in the fin edge region 740.

In an alternative embodiment, a bottom-up oxide deposition process may be performed. In this embodiment, oxide material (e.g., F-OX) 910 may be selectively deposited between the fins 710 up to the predetermined height corresponding to the narrow CD of the fins 710.

Figure 10:
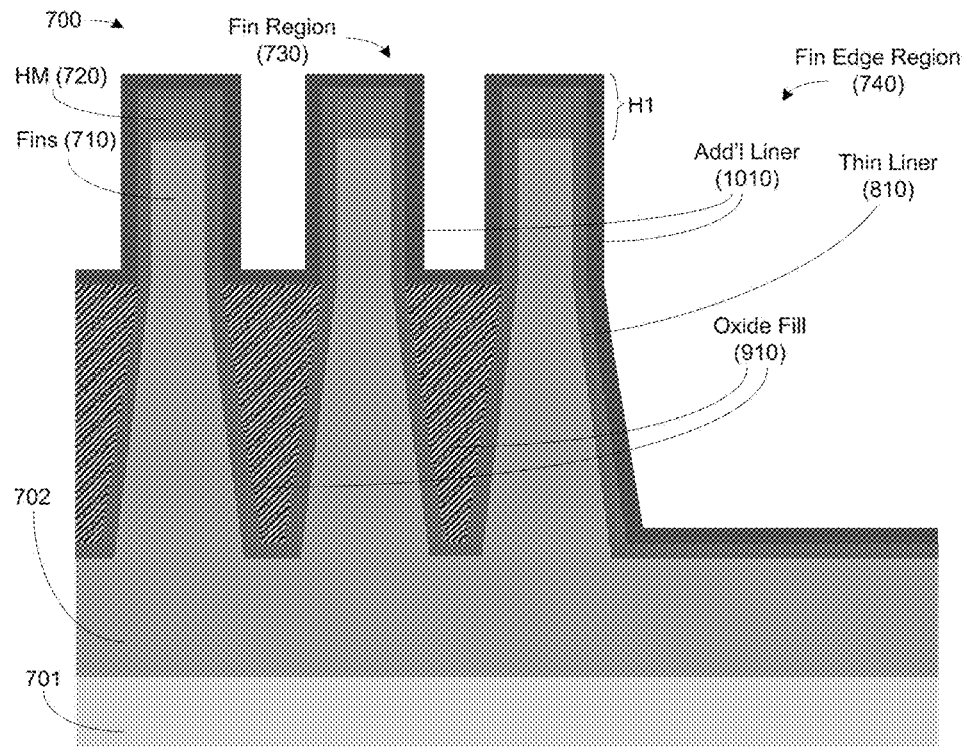

Referring to FIG. 10, an additional liner deposition process may be performed. The additional liner 1010 may be comprised of silicon nitride (SiN) material. The additional liner 1010 encapsulates the fins 710, the oxide material 910 in the fin region 930, and the fin edge region 740. In one embodiment, the additional liner 1010 may be slightly thicker than 1 nm. In one embodiment, the combination of the hard mask material 720, the thin liner 810, and the additional liner 1010 may be of a height (H1) of slightly larger than about 30 nm at the top of the fins 710. This thickness (H1) may be sufficient to prevent or substantially reduce oxidation.

In some cases, the bottom region of the fins 710 (i.e., the body of fins 710) may experience some oxidization. This oxidization may occur since the bottom portion of the fins 710 only comprises SiN material that is only about 1 nm.

However, since generally, current does not flow through the bottom region of the fins 710, and the fact that the fins 710 are wider at this part, oxidization in this region is more tolerable.

Figure 11:
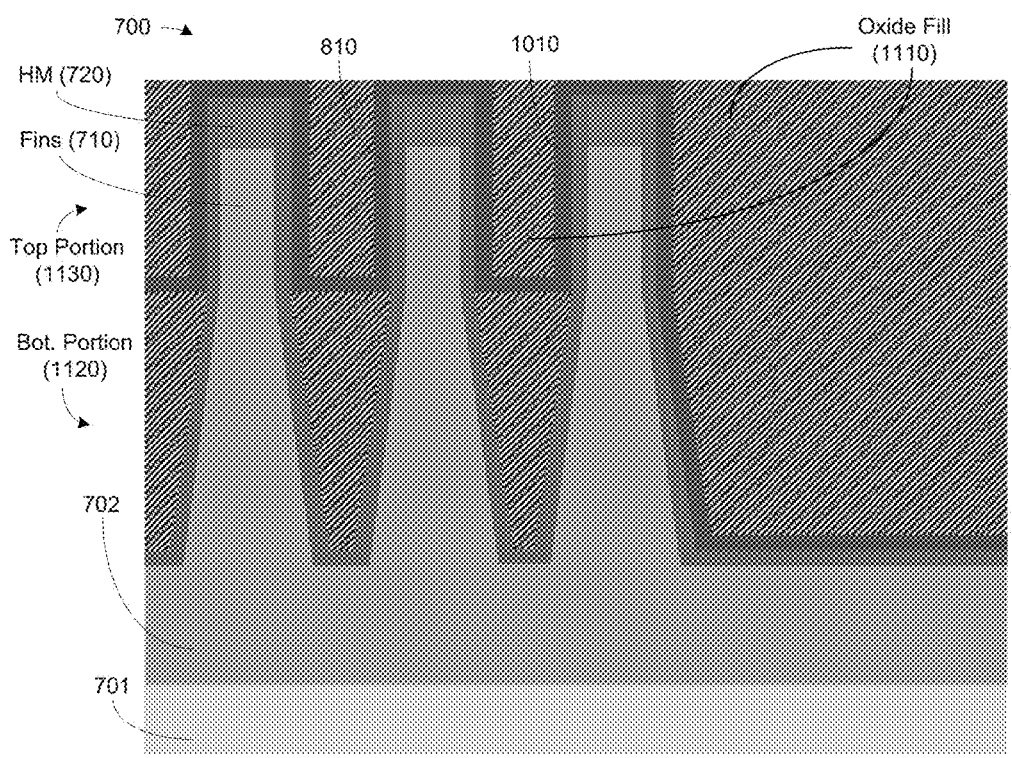

Referring to FIG. 11, an oxide deposition process followed by a chemical-mechanical polishing (CMP) process is performed. A layer of oxide material (e.g., F-OX) 1110 is deposited over the fin region 730 and the fin edge region 740 (above the additional liner layer 1010). The F-OX material may be filled in with relative ease because the trench depth above the SiN layer 1010 between the fins 710 is relatively shallow. Upon deposition of the various layers described above, due to the reduction of the aspect ratio, any voids between the fins 710 are substantially eliminated. Further a CMP process is performed on layer of oxide material 1110.

The fins 710 may be defined by a bottom portion 1120 and a top portion 1130, separated by a portion of the SiN layer 1010. In some cases, the bottom region 1120 of the fins 710 (i.e., body of fins 710) may experience some oxidization. This oxidization may occur since the bottom portion of the fins 710 comprises SiN material that is only about 1 nm. However, since generally, current does not flow through the bottom region 1120 of the fins 710, and the fact that the fins 710 are wider at this part, oxidization in this region is more tolerable. Further, due to the formations between the fins 710 described above, fin CD loss is also more tolerable. Generally, current flows at the top region 1130 of the fins 710, wherein the top region 1130 is filled and the liner at the top region 1130 is thicker, thereby preventing or substantially reducing oxidization. In one embodiment, a steam anneal and a shallow-trench isolation (STI) anneal may be performed. The SiN and oxide layer formed between the fins 710 provide for a reduction or substantial elimination of oxidization or modification of the fins 710.

Figure 12:
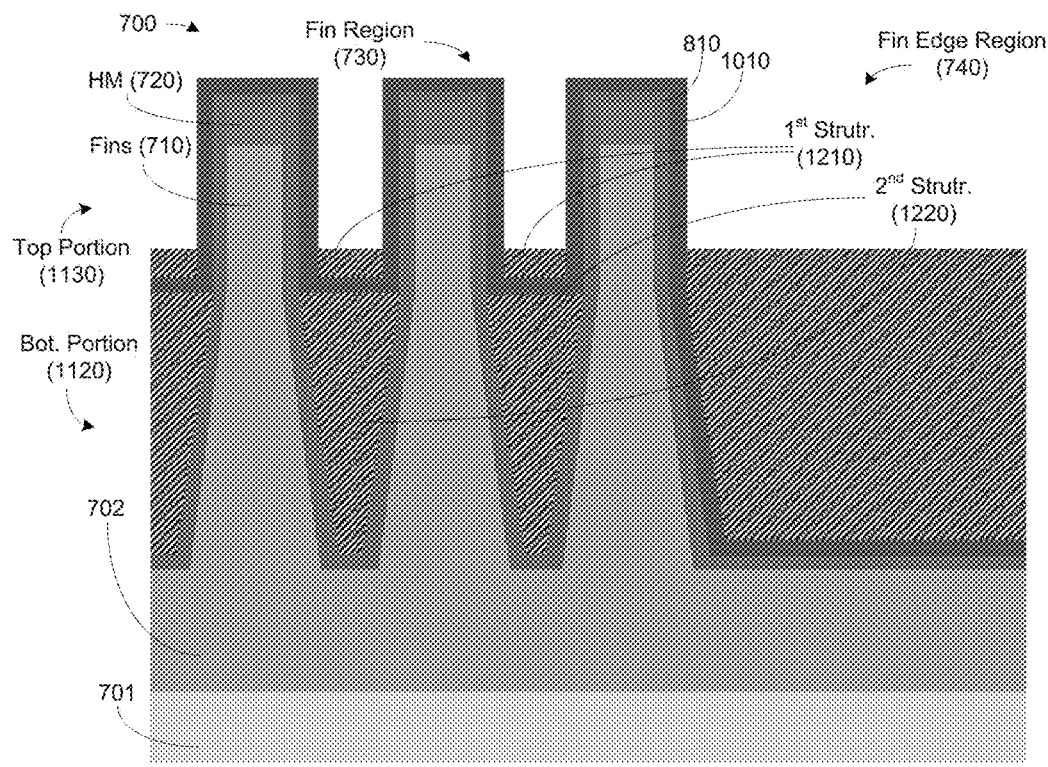
Figure 13:
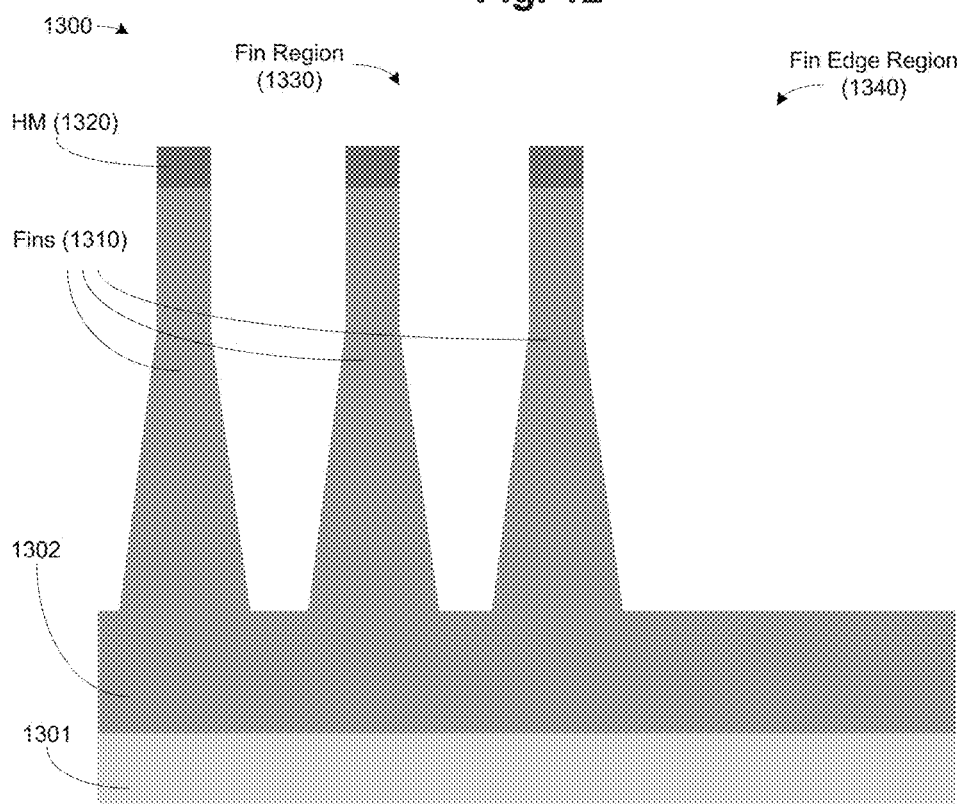

As shown in FIG. 12, a final fin reveal process and a hard mask/liner removal process is performed. There are two processes performed to provide the results illustrated in FIG. 12. A dry etch process is performed to recess the oxide material 1110. Further, a wet etch process is performed to remove the silicon nitride material (i.e., the hard mask layer 720, the thin liner 810, the additional liner 1010) from the top region 1130 of the fin region 730 and from the fin edge region 740.

These processes result in a unique structure formed between the fins 710, i.e., a first structure 1210. Further, these processes also result in a second structure 1220 between the fins 710, beneath the first structure 1210, separated by an SiN layer 1230. Therefore, the processes described above provide a dual structure formation between the fins 710. Those skilled in the art would appreciate that the first and second structures 1210, 1220 may vary in shape based on the specific processes and device specification that are utilized. The processes described above provides for forming fins 710 wherein oxide material is filled into any void between the fins, wherein this is performed while preventing fin oxidation or modification. Additional processes known to those skilled in the art having benefit of the present disclosure may be performed to complete manufacturing integrated circuit comprising finFET devices.

FIGS. 13-20 illustrate stylized depictions of cross-sectional views of further processing fins of a finFET device 1300, in accordance with a second embodiment of the present disclosure. In the manufacturing stage shown, the finFET device 1300 may comprise a substrate 1301, such as a silicon substrate or any other appropriate carrier material, on which may be formed an appropriate base layer 1302, which, in some illustrative embodiments, may represent an insulating layer, such as a silicon dioxide layer, a silicon nitride layer, a silicon oxynitride layer and the like. For example, if the substrate 1301 may be comprised of a substantially crystalline semiconductor material, the base layer 1302, if provided in the form of an insulating material, and the substrate 1301 may define a silicon on insulator (SOI) configuration.

Moreover, a plurality of fins 1310 are formed on the layer 1302 at a fin region 1330. The device 1300 also comprises a fin edge region 1340. The fins 1310 may be formed using silicon material or silicon germanium material (e.g., SiGe III-V). In some embodiments, the fins 1310 may be formed such that the spacing between the fins 1310 are relatively small, e.g., 50 nm. A hard mask cap structure 1320 may be formed on each of the fins 1310. The hard mask structure may be comprised of silicon nitride (SiN).

Figure 14:
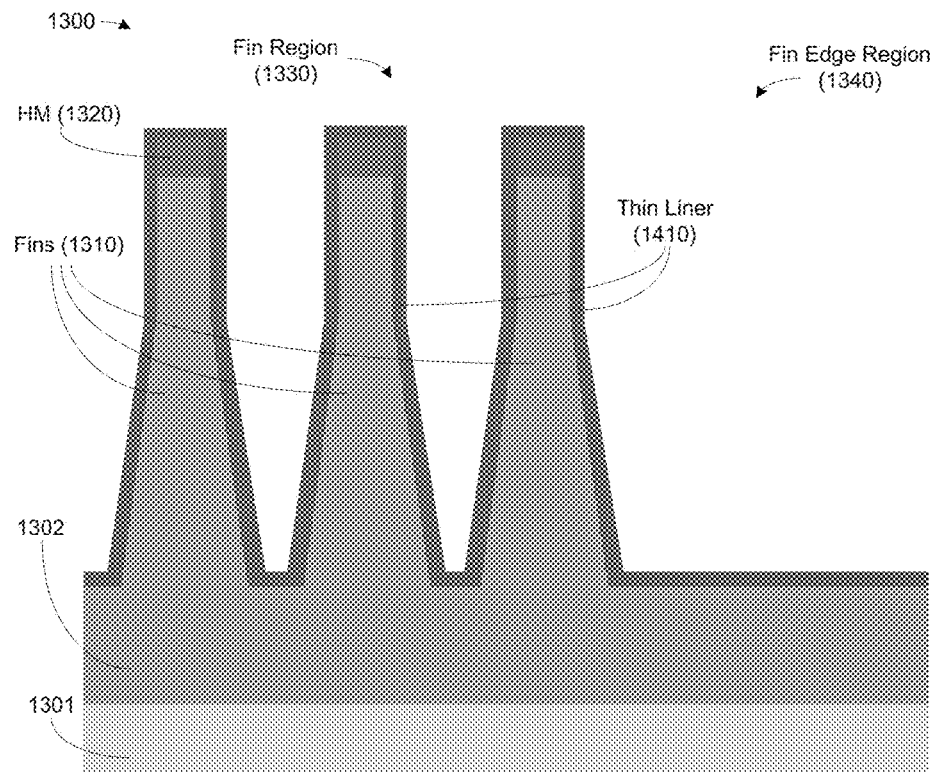

As shown in FIG. 14, a thin liner 1410 is deposited on the device 1300. The thin liner 1410 encapsulates fins 1310, the fin region 1330, as well as the fin edge region 1340. The thin liner 1410 may be sufficiently thick to prevent or reduce fin oxidization and provide fin CD protection, yet thin enough to allow for filling of the space between the fins 1310 with an insulation material, such as F-OX. In one embodiment, the thin liner 1410 may be less than about 3 nm.

Figure 15:
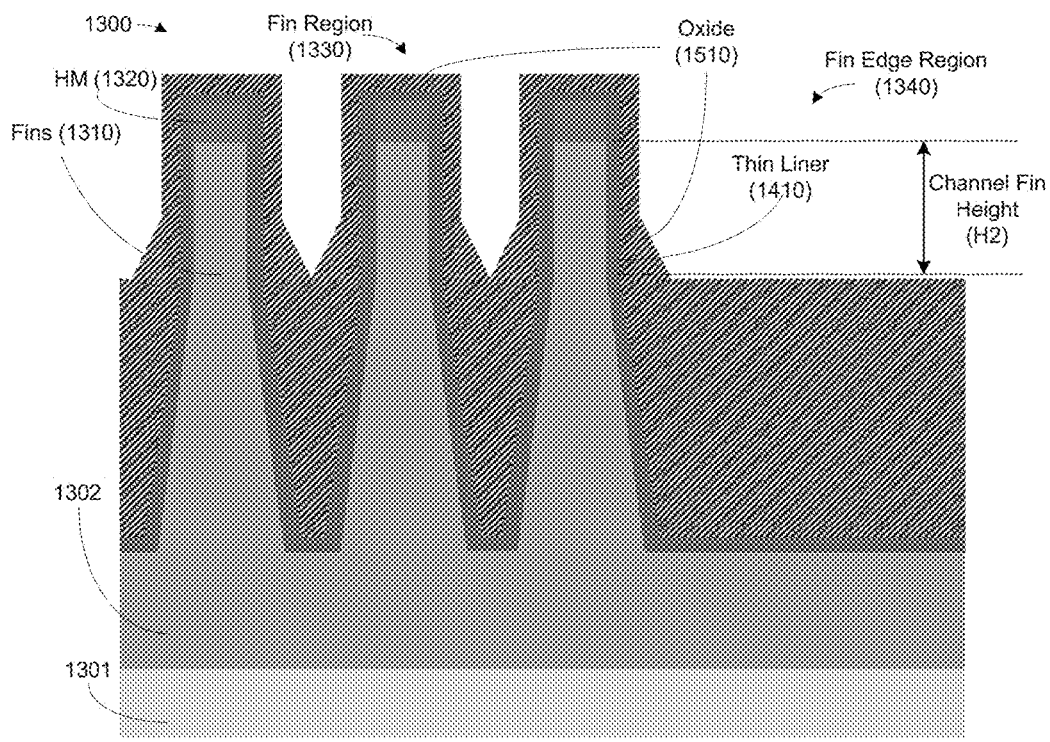

Referring to FIG. 15, partial oxide deposition and etch back process performed in the fin region 1330. Oxide material 1510 (e.g., F-OX) may be deposited in the fin region 730 and the fin edge region 1340. An etch process may then be performed to etch back the oxide material 1510 down to the bottom portion of the fins 1310 to a predetermined height, as depicted in FIG. 15.

Between the fins 1310 in the fin channels, at the bottom portion of the fins 1310, the oxide material 1510 is fully deposited. Above the bottom portion of the fins 1310, based on a predetermined channel fin height (H2), the oxide material 1510 is only partially deposited, coating the fins 1510 in this upper portion, as depicted in FIG. 15. That is, a small amount of oxide is deposited on the sidewalls and top of the fins 1310 in the upper portion of the fins 1310. In one embodiment, a fin chemical vapor deposition (FCVD) process may be used to perform this coating process.

In an alternative embodiment, a bottom-up oxide deposition process may be performed to deposit the oxide material 1510 in the lower portion of the fin region 1330 and the fin edge region 1340. In this embodiment, oxide material (e.g., F-OX) 1510 may be selectively deposited between the fins 1310 up to the predetermined height corresponding to the narrow CD of the fins 1310. This process may be followed by a FCVD process to coat the fins 1310 with the oxide material 1510.

Figure 16:
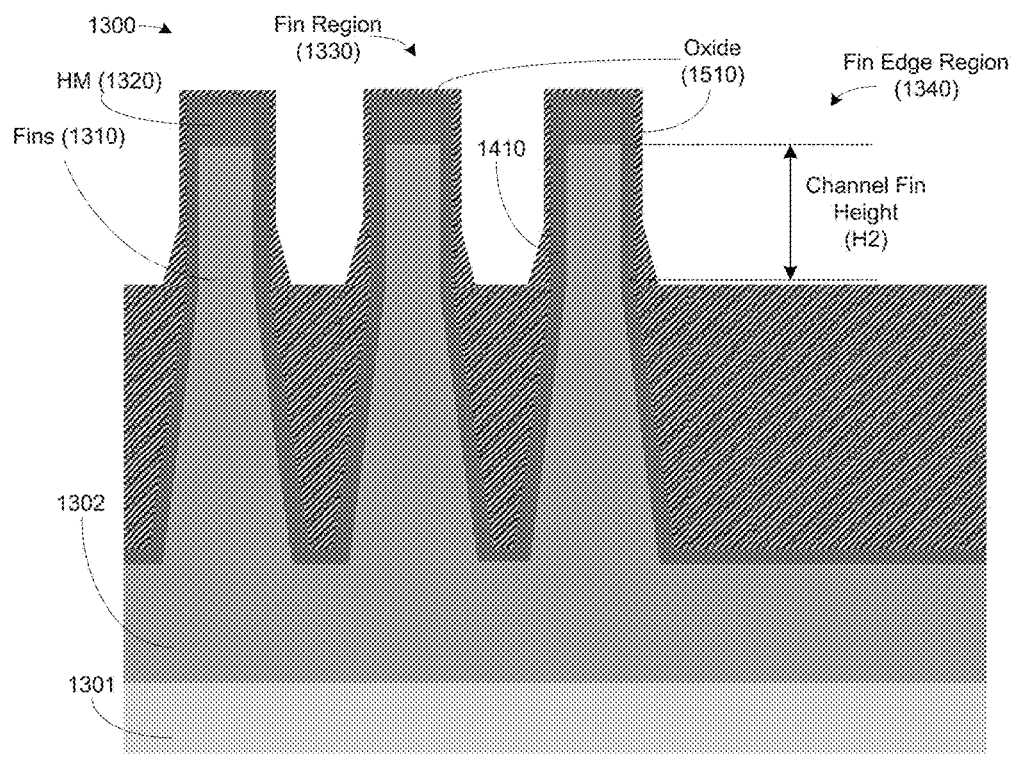

Referring to FIG. 16, a steam anneal process for densification may be performed. As shown in FIG. 16, the coating of the oxide material 1510 on the fins at the channel fin height, H2 is thinner after the steam anneal process. Since the FCVD process performed on the upper portion of the fins resulted in a partially filled channel region, the CD loss may be minimized during the densification anneal process.

As a result of the processes described above, the densification anneal process may be performed at a lower time/temperature budget. For example, in one embodiment, the steam anneal process is performed at a lower temperature. This may prevent oxidization on the fins 1310 since oxidization generally only occurs at higher temperatures. In another embodiment, the steam anneal process may be performed at a slightly higher temperature, but for a lesser duration of time, which may also reduce oxidization of the fins 1310.

Figure 17:
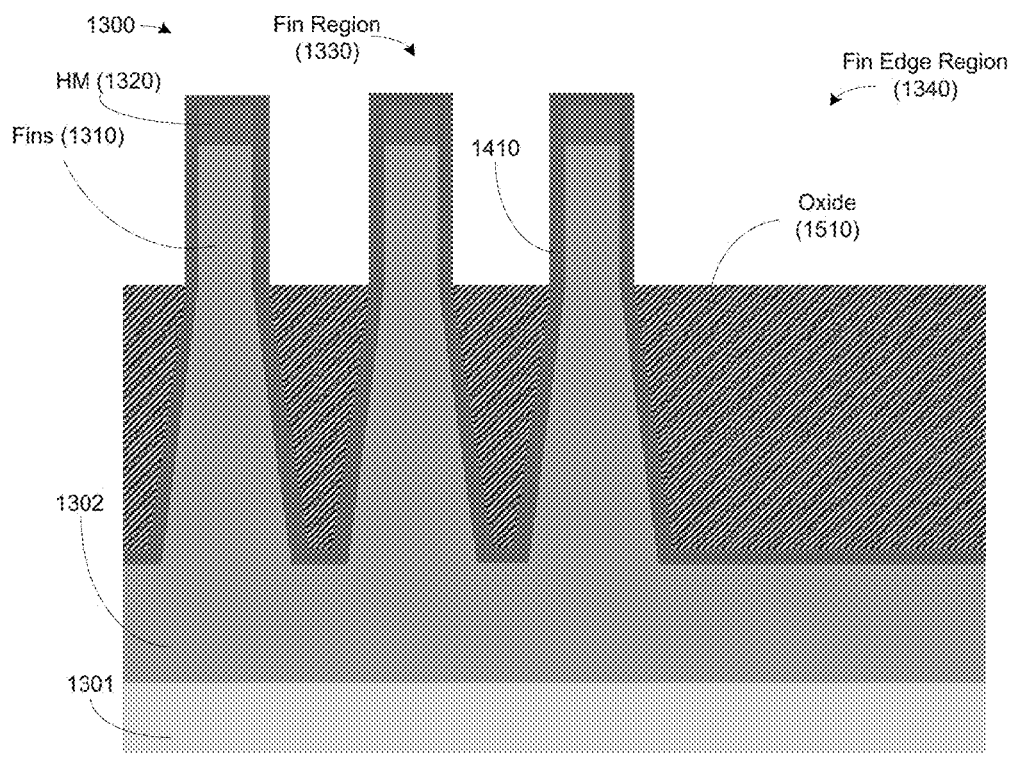

As shown in FIG. 17, an oxide recess process may be performed. The oxide recess process results in oxide material 1510 between the channel regions in the fin region 1330 and in the fin edge region 1340. The FCVD oxide material 1510 is recessed down to a predetermined height in the lower portion of fin region 1330 and in the fin edge region 1340. The oxide recess process may be performed using a wet etch process (e.g., SiCoNi etch process) or a dry etch process (e.g., chemical oxide removal (COR) etch process).

Figure 18:
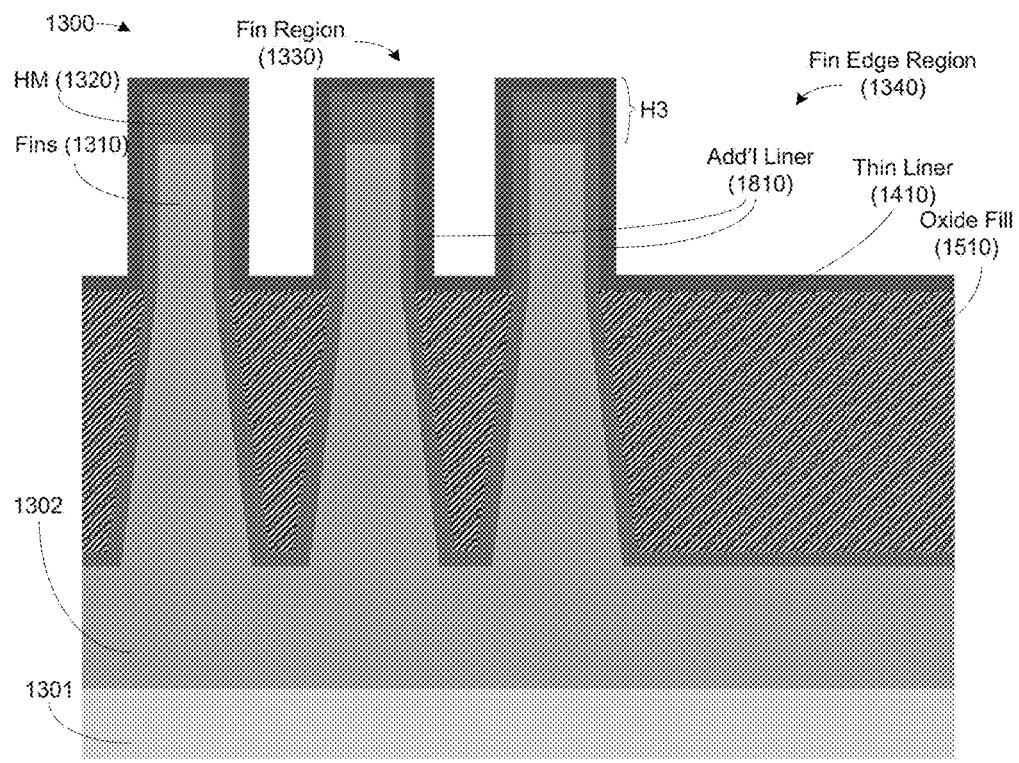

Referring to FIG. 18, an additional liner deposition process may be performed. The additional liner 1810 may be comprised of silicon nitride (SiN) material. The additional liner 1810 encapsulates the fins 1310, the oxide material 1510 in the fin region 1530, as well as the oxide material in the fin edge region 1340. In one embodiment, the additional liner 1810 may be slightly thicker than 1 nm. In one embodiment, the combination of the hard mask material 1320, the thin liner 810, and the additional liner 1810 may be of a height (H3) of slightly larger than about 30 nm at the top of the fins 1310. This thickness (H3) may be sufficient to prevent or substantially reduce oxidation.

In some cases, the bottom region of the fins 1310 (i.e., the body of fins 1310) may experience some oxidization. This oxidization may occur since the bottom portion of the fins 1310 only comprises SiN material that is only about 1 nm. However, since generally, current does not flow through the bottom region of the fins 1310, and the fact that the fins 1310 are wider at this part, oxidization in this region is more tolerable.

Figure 19:
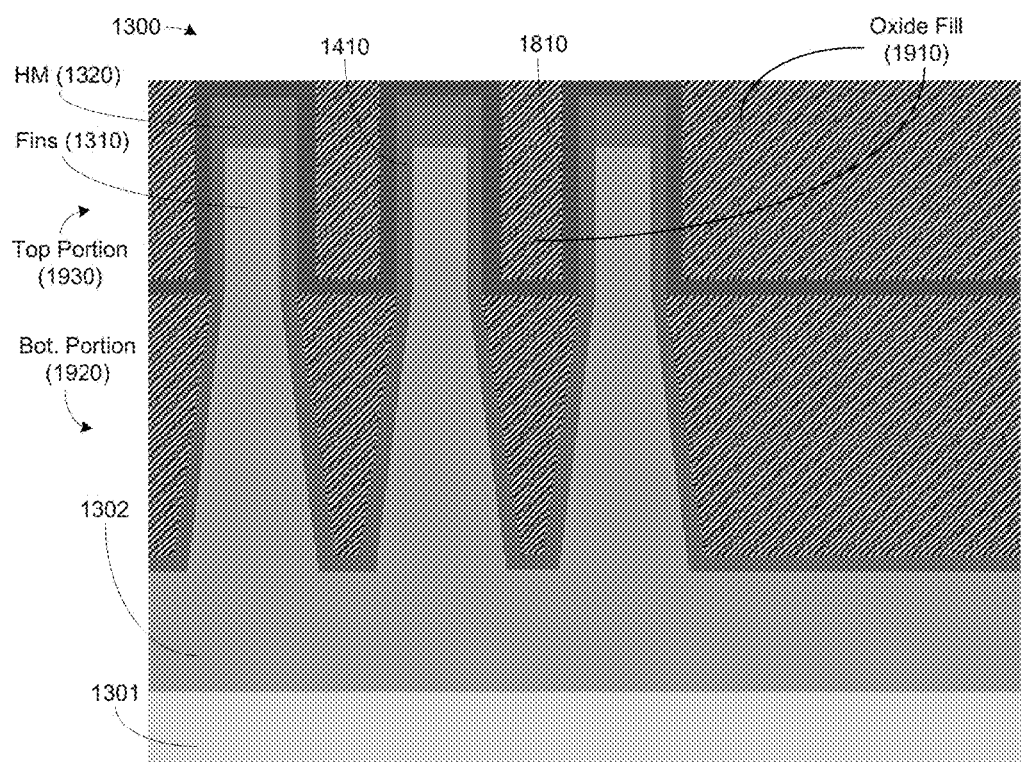

Referring to FIG. 19, an oxide deposition process followed by a CMP process is performed. A layer of oxide material (e.g., F-OX) 1910 is deposited over the fin region 1330 and the fin edge region 1340 above the SiN layer 1810. The F-OX material may be filled in with relative ease because the trench depth above the SiN layer 1810 between the fins 1310 is relatively shallow. Upon deposition of the various layers described above, due to the reduction of the aspect ratio, any voids between the fins 1310 are substantially eliminated. Further a CMP process is performed on layer of oxide material 1910.

The fins 1310 may be defined by a bottom portion 1920 and a top portion 1930, separated by a portion of the SiN layer 1810. In some cases, the bottom region 1920 of the fins 1310 (i.e., body of fins 1310) may experience some oxidization. This oxidization may occur since the bottom portion of the fins 1310 only comprises SiN material that is only about 1 nm. However, since generally, current does not flow through the bottom region 1920 of the fins 1310, and the fact that the fins 1310 are wider at this part, oxidization in this region is more tolerable. Further, due to the formations between the fins 1310 described above, fin CD loss is also more tolerable. As noted above, current flows at the top region 1930 of the fins 1310, wherein the top region 1930 is filled and the liner at the top region 1930 is thicker, thereby preventing or substantially reducing oxidization. The SiN and oxide layer formed between the fins 1310 provide for a reduction or substantial elimination of oxidization or modification of the fins 1310.

Figure 20:
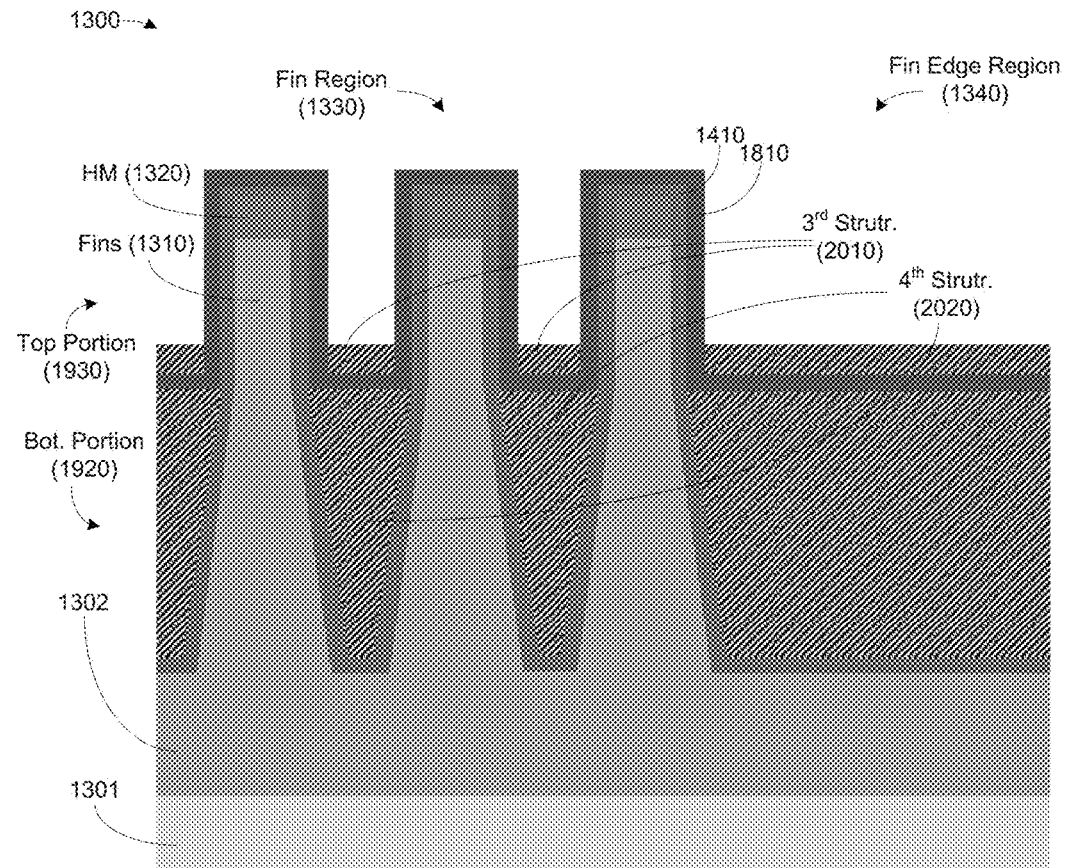

As shown in FIG. 20, a final fin reveal process and a hard mask/liner removal process is performed. There are two processes performed to provide the results illustrated in FIG. 20. A dry etch process is performed to recess the oxide material 1910. Further, a wet etch process is performed to remove the silicon nitride material (i.e., the hard mask layer 1320, the thin liner 810, the additional liner 1810) from the top region 1930 of the fin region 1330 and from the fin edge region 1340.

These processes result in a unique structure formed between the fins 1310, i.e., a third structure 2010. Further, these processes also result in a fourth structure 2020 between the fins 1310, beneath the first structure 2010, separated by an SiN layer 2030. Therefore, the processes described above provide a dual structure formation between the fins 1310. Those skilled in the art would appreciate that the third and fourth structures 2010, 2020 may vary in shape based on the specific processes and device specifications that are utilized.

The processes described above provides for forming fins 1310 wherein oxide material is filled into any void between fins, wherein this is performed while preventing fin oxidation or modification. Additional processes known to those skilled in the art having benefit of the present disclosure may be performed to complete manufacturing integrated circuit comprising finFET devices. Embodiments described herein may be applied to gate fins, source fins, and/or drain fins.

Figure 21:
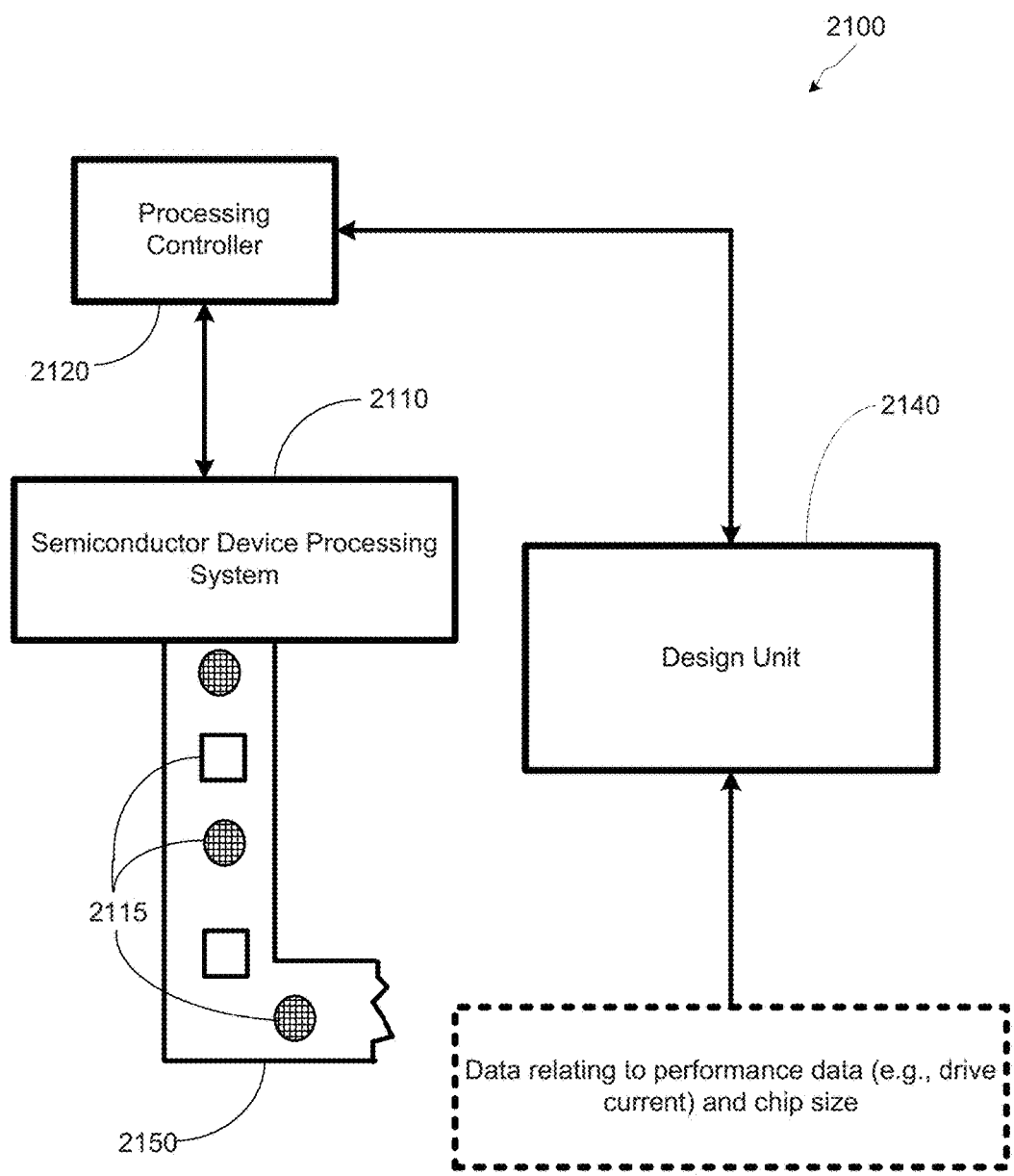
FIG. 21 illustrates a stylized depiction of a system for fabricating a semiconductor device package comprising finFET devices, in accordance with embodiments herein.

Turning now to FIG. 21, a stylized depiction of a system for fabricating a semiconductor device package comprising a topside interconnection substrate, in accordance with embodiments herein, is illustrated. The system 2100 of FIG. 21 may comprise a semiconductor device processing system 2110 and a design unit 2140. The semiconductor device processing system 2110 may manufacture integrated circuit devices based upon one or more designs provided by the design unit 2140.

The semiconductor device processing system 2110 may comprise various processing stations, such as etch process stations, photolithography process stations, CMP process stations, etc. One or more of the processing steps performed by the processing system 2110 may be controlled by the processing controller 2120. The processing controller 2120 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 2110 may produce integrated circuits on a medium, such as silicon wafers. More particularly, the semiconductor device processing system 2110 produce integrated circuits having finFET devices that comprise fins that have channel voids filled with oxide and performed in a manner to reduce or substantially prevent oxidization, as described above.

The production of integrated circuits by the device processing system 2110 may be based upon the circuit designs provided by the integrated circuits design unit 2140. The processing system 2110 may provide processed integrated circuits/devices 2115 on a transport mechanism 2150, such as a conveyor system. In some embodiments, the conveyor system may be sophisticated clean room transport systems that are capable of transporting semiconductor wafers. In one embodiment, the semiconductor device processing system 2110 may comprise a plurality of processing steps, e.g., the $1^{st}$ process step, the $2^{nd}$ process set, etc., as described above.

In some embodiments, the items labeled "2115" may represent individual wafers, and in other embodiments, the items 2115 may represent a group of semiconductor wafers, e.g., a "lot" of semiconductor wafers. The integrated circuit or device 2115 may be a transistor, a capacitor, a resistor, a memory cell, a processor, and/or the like.

The integrated circuit design unit 2140 of the system 2100 is capable of providing a circuit design that may be manufactured by the semiconductor processing system 2110. The integrated circuit design unit 2140 may be capable of determining the number of devices (e.g., processors, memory devices, etc.) to place in a device package. The integrated circuit design unit 2140 may also determine the height of the fins, the size of the fin channels, etc. These dimensions may be based upon data relating to drive currents/performance metrics, device dimensions, etc. Based upon such details of the devices, the integrated circuit design unit 2140 may determine specifications of the finFETs that are to be manufactured. Based upon these specifications, the integrated circuit design unit 2140 may provide data for manufacturing a semiconductor device package described herein.

The system 2100 may be capable of performing analysis and manufacturing of various products involving various technologies. For example, the system 2100 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a plurality of fins of a transistor;
   forming a hard mask layer on top of said fins;
   forming a first liner layer over said fins and said hard mask layer;
   performing a partial deposition process for depositing a first insulation material in a first portion of a channel between said fins;
   forming a second liner layer above said fins, said first insulation material, and said channel;
   depositing a second insulation material above said second liner layer;
   performing a fin reveal process for removing said second insulation material to a predetermined height; and
   performing an etch process for removing said hard mask layer and said first and second liner layers above said predetermined height.

2. The method of claim 1, further comprises forming a first structure from said first insulation material and a second structure from said second insulation material, wherein said first and second structures are formed in said channel and are separated by a portion of said second liner layer.

3. The method of claim 1, wherein performing a partial deposition process for depositing said first insulation material comprises depositing a flowable oxide material and wherein said flowable oxide material is deposited to a first predetermined height at a bottom region of said fins.

4. The method of claim 1, wherein forming said first liner layer comprises depositing a silicon nitride layer over said fins and said hard mask layer, and wherein said first liner layer is about 3 nm thick.

5. The method of claim 1, wherein forming a plurality of fins of a transistor comprises forming a plurality of fins comprised of at least one of silicon and silicon germanium.

6. The method of claim 1, wherein forming said partial oxide deposition process for depositing a first insulation material in a first portion of said channel comprises depositing an oxide material at the bottom portion of said fins.

7. The method of claim 1, wherein forming said second liner layer depositing a silicon nitride layer an upper portion of said fins, said first insulation layer, and a portion of said first liner layer.

8. The method of claim 1, wherein depositing said second insulation material above said second liner layer comprises depositing a layer of silicon nitride.

9. The method of claim 1, further comprising performing a steam anneal process and a shallow trench isolation anneal process in the presence of said second insulation material, said hard mask layer, and said second liner layer.

10. A system, comprising:
    a semiconductor device processing system to manufacture a semiconductor device comprising at least one fin field effect transistor (finFET); and
    a processing controller operatively coupled to said semiconductor device processing system, said processing controller configured to control an operation of said semiconductor device processing system;
    wherein said semiconductor device processing system is adapted to:
      form a plurality of fins of a transistor;
      form a hard mask layer on top of said fins;
      form a first liner layer over said fins and said hard mask layer;
      perform a partial deposition process for depositing a first insulation material in a first portion of a channel between said fins;
      form a second liner layer above said fins, said first insulation material, and said channel;
      deposit a second insulation material above said second liner layer;
      perform a fin reveal process for removing said second insulation material to a predetermined height; and
      perform an etch process for removing said hard mask layer and said first and second liner layers above said predetermined height.

11. The system of claim 10, further comprising a design unit configured to generate a first design comprising a definition for a process mask and a definition for forming said fins, wherein data from said design unit is used by said process controller to control an operation of said semiconductor device processing system.

12. The system of claim 10, wherein said first insulation material is a flowable oxide material.

13. The system of claim 10, wherein said fins are comprised of at least one of silicon or silicon germanium.

14. The system of claim 10, wherein said first and second insulation are capable of substantially preventing critical dimension loss and said first and second liner layers are capable of reducing oxidization of said fins.

15. The system of claim 10, wherein said channel comprises a first structure comprising said first insulation material and a second structure comprising said second insulation material, wherein said first and second structures are formed in said channel and are separated by a portion of said second liner layer.

* * * * *